US012648215B2

(12) United States Patent
Zhang et al.

(10) Patent No.: US 12,648,215 B2
(45) Date of Patent: Jun. 2, 2026

(54) METHOD FOR FABRICATING A SEMICONDUCTOR STRUCTURE

(71) Applicant: United Semiconductor (Xiamen) Co., Ltd., Xiamen (CN)

(72) Inventors: Shouguo Zhang, Singapore (SG); Yongbo Xu, Xia Men (CN); Wen Yi Tan, Xiamen (CN)

(73) Assignee: United Semiconductor (Xiamen) Co., Ltd., Xiamen (CN)

( * ) Notice: Subject to any disclaimer, the term of this patent is extended or adjusted under 35 U.S.C. 154(b) by 389 days.

(21) Appl. No.: 18/233,333

(22) Filed: Aug. 14, 2023

(65) Prior Publication Data

US 2025/0031433 A1     Jan. 23, 2025

(30) Foreign Application Priority Data

Jul. 20, 2023    (CN) .......................... 202310895133.9

(51) Int. Cl.
| | |
|---|---|
| *H10D 84/03* | (2025.01) |
| *H10D 64/01* | (2025.01) |
| *H10D 84/01* | (2026.01) |
| *H10P 14/44* | (2026.01) |
| *H10W 20/00* | (2026.01) |

(52) U.S. Cl.
CPC ......... *H10D 84/038* (2025.01); *H10D 64/017* (2025.01); *H10D 84/0172* (2025.01); *H10P 14/44* (2026.01); *H10W 20/056* (2026.01); *H10W 20/074* (2026.01)

(58) Field of Classification Search
CPC ............... H10D 84/038; H10D 64/017; H10D 84/0172; H10D 64/667; H01L 21/2855; H01L 21/76829; H01L 21/76877; H01L 21/28088; H01L 21/67253; C23C 14/54
See application file for complete search history.

(56) References Cited

U.S. PATENT DOCUMENTS

| | | | | |
|---|---|---|---|---|
| 9,524,968 B1 * | 12/2016 | Lai | ........................ | H10D 64/017 |
| 2012/0292721 A1 * | 11/2012 | Huang | ................... | H10D 30/60 257/412 |
| 2013/0045594 A1 * | 2/2013 | Wang | ................. | H10D 84/0177 438/589 |
| 2014/0306273 A1 * | 10/2014 | Ho | ..................... | H10D 30/0227 257/288 |
| 2015/0069533 A1 * | 3/2015 | Lin | ...................... | H10D 30/601 257/410 |
| 2016/0244874 A1 * | 8/2016 | Ge | ........................... | H03J 7/04 |
| 2018/0358448 A1 * | 12/2018 | Chiang | ............. | H10D 84/0177 |

* cited by examiner

*Primary Examiner* — Teresa M. Arroyo
(74) *Attorney, Agent, or Firm* — Winston Hsu

(57)    ABSTRACT

A method for fabricating a semiconductor structure is disclosed. A substrate having a dielectric layer thereon and a gate trench formed in the dielectric layer is prepared. The substrate is subjected to a physical vapor deposition (PVD) process in a physical vapor deposition chamber equipped with an auto capacitance tuner to conformally deposit a metal layer on a top surface of the dielectric layer and on an interior surface of the gate trench. The PVD process comprises: (i) tuning the auto capacitance tuner to provide positive radio frequency (RF) bias to the substrate in the PVD chamber for a first time period; and (ii) subsequently tuning the auto capacitance tuner to provide negative RF bias to the substrate in the PVD chamber for a second time period.

16 Claims, 5 Drawing Sheets

1

METHOD FOR FABRICATING A SEMICONDUCTOR STRUCTURE

BACKGROUND OF THE INVENTION

1. Field of the Invention

The invention relates to the field of semiconductor technology, in particular to a method for manufacturing a semiconductor structure.

2. Description of the Prior Art

High-k dielectrics and metal gate electrodes have entered complementary metal-oxide-semiconductor (CMOS) logic technology, integrated in both gate-first and gate-last schemes.

The gate-last process may be implemented to address the concerns of high temperature processing on metal materials. In a gate-last process, a dummy poly gate is initially formed and not removed until deposition of an interlayer dielectric (ILD). In a later stage, the dummy poly gate may be replaced with a metal gate. The metal gate is then polished to a desired gate height.

As the gate length and spacing between devices decrease, it is difficult to achieve a low gate resistance for a transistor because voids are generated in the metal gate electrode after metal layer deposition for gap filling of a high-aspect-ratio trench. In particular, the work function metal layer of NMOS transistors is more likely to cause problems such as overhang, too thin sidewall deposition thickness, and bottom hump profile due to uneven deposition.

SUMMARY OF THE INVENTION

It is one objective of the present invention to provide an improved manufacturing method of a semiconductor structure to solve the deficiencies or shortcomings of the prior art.

One aspect of the invention provides a method for fabricating a semiconductor structure. A substrate having a dielectric layer thereon is provided. A gate trench is formed in the dielectric layer. A physical vapor deposition (PVD) process is performed on the substrate in a physical vapor deposition chamber equipped with an auto capacitance tuner to conformally deposit a metal layer on a top surface of the dielectric layer and on an interior surface of the gate trench. The PVD process comprises: (i) tuning the auto capacitance tuner to provide positive radio frequency (RF) bias to the substrate in the PVD chamber for a first time period; and (ii) subsequently tuning the auto capacitance tuner to provide negative RF bias to the substrate in the PVD chamber for a second time period.

According to some embodiments, the dielectric layer comprises a silicon oxide layer.

According to some embodiments, the method further includes the step of forming a contact etch stop layer between the dielectric layer and the substrate.

According to some embodiments, the method further includes the step of forming a spacer layer between the metal layer and the contact etch stop layer.

According to some embodiments, the semiconductor structure is a metal gate of an NMOS transistor.

According to some embodiments, the metal layer is NMOS work function layer.

According to some embodiments, the metal layer comprises TiAl.

According to some embodiments, the method further includes the step of depositing a barrier layer on the metal layer within the gate trench.

According to some embodiments, the barrier layer comprises TiN.

According to some embodiments, the method further includes the step of depositing an adhesion layer on the barrier layer within the gate trench.

According to some embodiments, the adhesion layer comprises Ti.

According to some embodiments, the method further includes the step of depositing a low-resistance conductive layer on the adhesion layer within the gate trench, wherein the metal layer, the barrier layer, the adhesion layer, and the low-resistance conductive layer completely fills the gate trench.

According to some embodiments, the low-resistance conductive layer comprises Al.

According to some embodiments, the positive RF bias is +85V and the first time period is 10-30 seconds.

According to some embodiments, the negative RF bias is 0V to −250V and the second time period is 10-30 seconds.

According to some embodiments, the metal layer has a thickness of 80-120 angstroms.

These and other objectives of the present invention will no doubt become obvious to those of ordinary skill in the art after reading the following detailed description of the preferred embodiment that is illustrated in the various figures and drawings.

DETAILED DESCRIPTION

In the following detailed description of the disclosure, reference is made to the accompanying drawings, which form a part hereof, and in which is shown, by way of illustration, specific embodiments in which the invention may be practiced. These embodiments are described in sufficient detail to enable those skilled in the art to practice the invention.

Other embodiments may be utilized, and structural, logical, and electrical changes may be made without departing from the scope of the present invention. Therefore, the following detailed description is not to be considered as limiting, but the embodiments included herein are defined by the scope of the accompanying claims.

Figure 1:
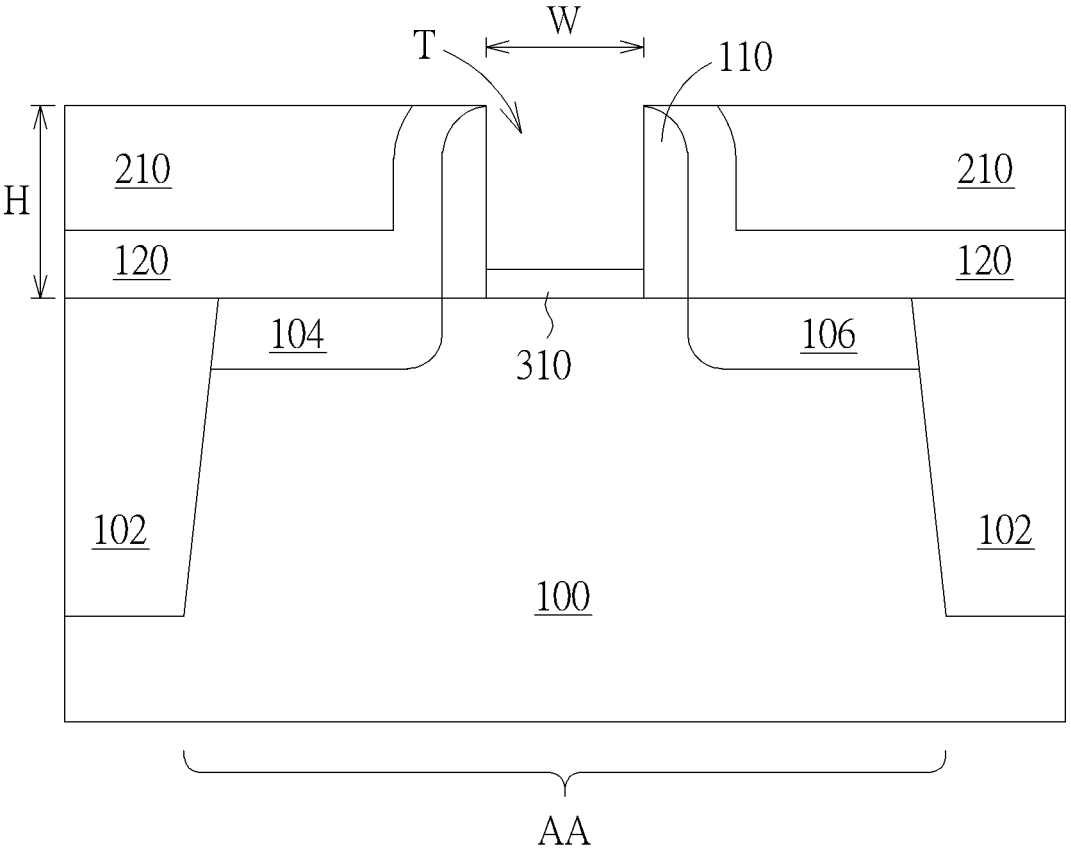
FIG. 1 to FIG. 4 are schematic diagrams of a method for fabricating a semiconductor structure according to an embodiment of the present invention.

Please refer to FIG. 1 to FIG. 4, which are schematic diagrams of a method for fabricating a semiconductor structure according to an embodiment of the present invention. According to an embodiment of the present invention, the semiconductor structure may be a metal gate of an NMOS transistor. As shown in FIG. 1, a substrate 100, for example, a silicon substrate is provided. The substrate 100 comprises an NMOS transistor region NR. A trench isolation structure 102 is formed in the substrate 100 within the NMOS transistor region NR to electrically isolate the active region AA. Doped regions 104 and 106 may be provided in the substrate 100 within the active area AA. For example, the doped regions 104 and 106 may be N-type doped regions, which may function as the source and drain of the NMOS transistor.

According to an embodiment of the present invention, after the interlayer dielectric layer 210 is formed on the substrate 100 by the gate-last process, the dummy polysilicon gate (not shown) is removed to form the gate trench T. The width w of the gate trench T is equal to the distance between two opposite inner surfaces of the spacer layer 110. According to an embodiment of the present invention, for example, the width w may be between 200-300 angstroms, but is not limited thereto. According to an embodiment of the present invention, for example, the depth H of the gate trench T may be 400-500 angstroms, but not limited thereto. According to an embodiment of the present invention, for example, an aspect ratio (H/w) of the gate trench T may be between 1.5-2.

According to an embodiment of the present invention, for example, the interlayer dielectric layer 210 may include silicon oxide or a low dielectric constant material layer, but is not limited thereto. According to an embodiment of the present invention, for example, the spacer layer 110 may include silicon oxide, silicon oxynitride, or the like. According to an embodiment of the present invention, a contact etch stop layer 120, such as a silicon nitride layer, may be formed between the spacer layer 110 and the interlayer dielectric layer 210.

According to an embodiment of the present invention, a gate dielectric layer 310 may be formed at the bottom of the gate trench T. Referring to FIG. 1. According to an embodiment of the present invention, the gate dielectric layer 310 may include a silicon oxide layer or a high dielectric constant material layer, such as hafnium oxide, but is not limited thereto.

Figure 2:
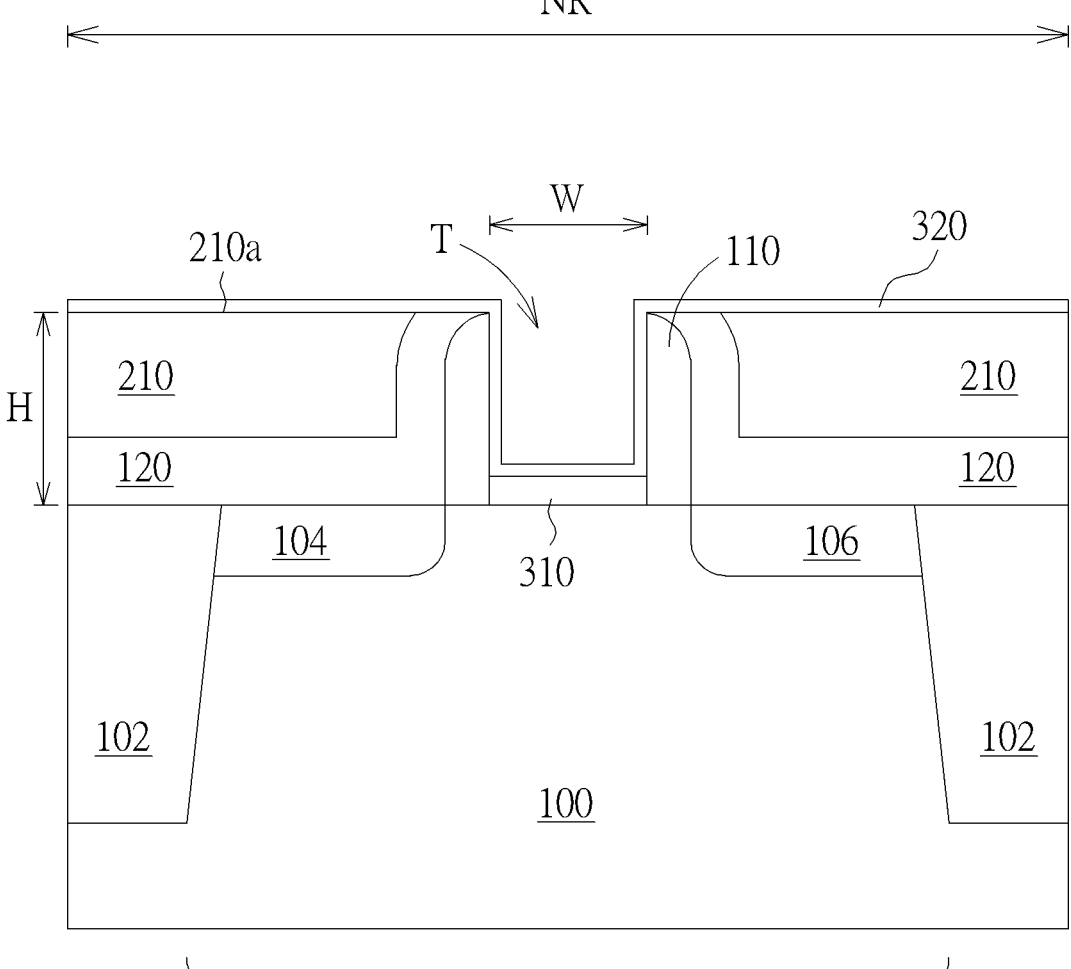

Next, as shown in FIG. 2, a physical vapor deposition process is performed on the substrate 100 in a physical vapor deposition (PVD) chamber equipped with an auto capacitance tuner (ACT). The metal layer 320 is conformally deposited on the top surface 210*a* of the interlayer dielectric layer 210 and on the interior surface of the gate trench T. According to an embodiment of the present invention, the metal layer 320 is an NMOS work function layer. According to an embodiment of the present invention, for example, the metal layer 320 may include TiAl. According to an embodiment of the present invention, the thickness of the metal layer 320 is 80-120 angstroms, for example, 100 angstroms.

Figure 5:
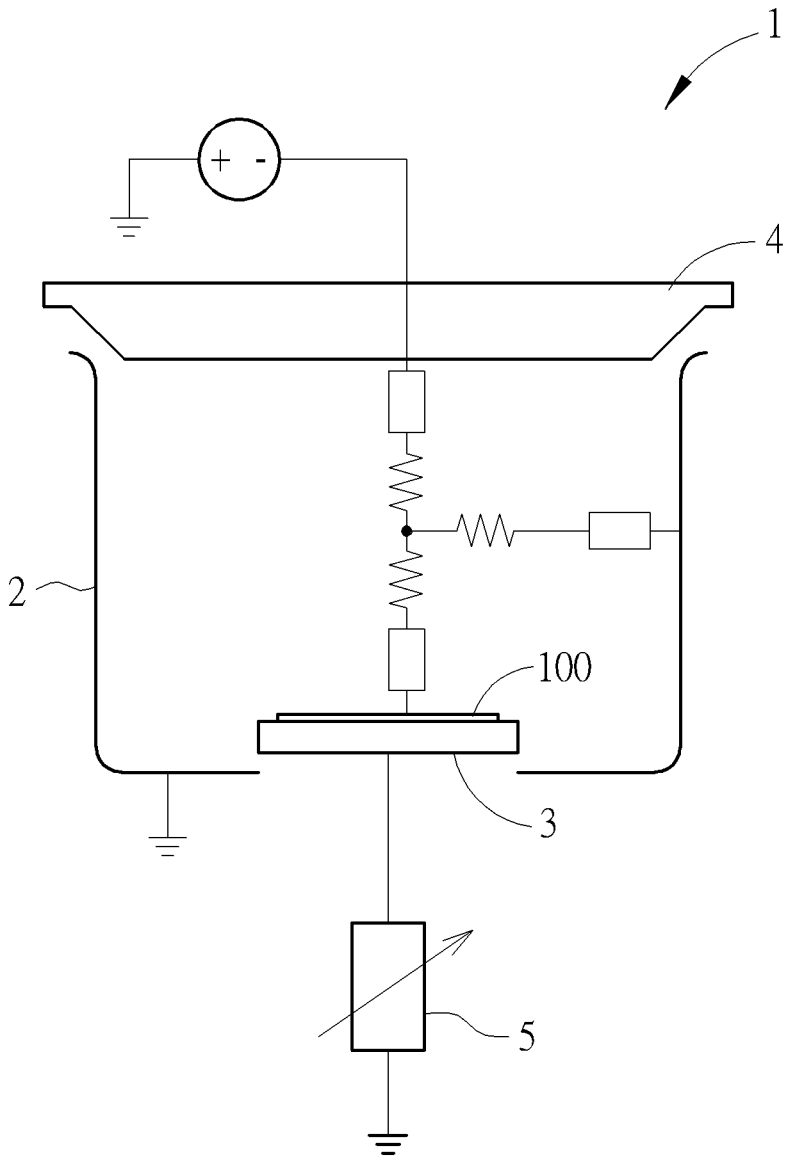
FIG. 5 illustrates a PVD chamber equipped with an auto capacitance tuner.

FIG. 5 illustrates a PVD chamber equipped with an auto capacitance tuner. The PVD chamber 1 includes a grounded shield 2, which is equipped with at least a substrate support 3, a target 4, and an auto capacitance tuner 5 connected to the substrate support 3. The auto capacitance tuner 5 adjusts the capacitance (and thus impedance) from the substrate support pedestal electrode to ground. In some embodiments, the current across the auto capacitance tuner 5 may be measured to determine the ion energy at the substrate 100 and the position or set point of the auto capacitance tuner 5 can be adjusted if necessary in response to the measured current in order to maintain the ion energy at the substrate 100 at the desired level as described above. Alternatively, the bias voltage on the substrate 100 can be measured and used to determine whether the actual ion energy needs to be increased or decreased (and the auto capacitance tuner 5 adjusted) to maintain the ion energy at the substrate at the desired level.

According to an embodiment of the present invention, for example, the physical vapor deposition process includes: (i) adjusting the auto capacitance tuner 5 to provide a positive radio frequency (RF) bias voltage to the substrate 100 in the PVD chamber 1 within a first time period; and (ii) adjusting the auto capacitance tuner 5 to provide a negative RF bias voltage to the substrate 100 in the PVD chamber 1 for a second period of time. According to an embodiment of the present invention, the positive RF bias voltage is +85V, and the first time period is 10-30 seconds. According to an embodiment of the present invention, the negative RF bias voltage is 0V to −250V, and the second time period is 10-30 seconds. According to an embodiment of the present invention, the above step (i) and step (ii) may be repeated.

Figure 3:
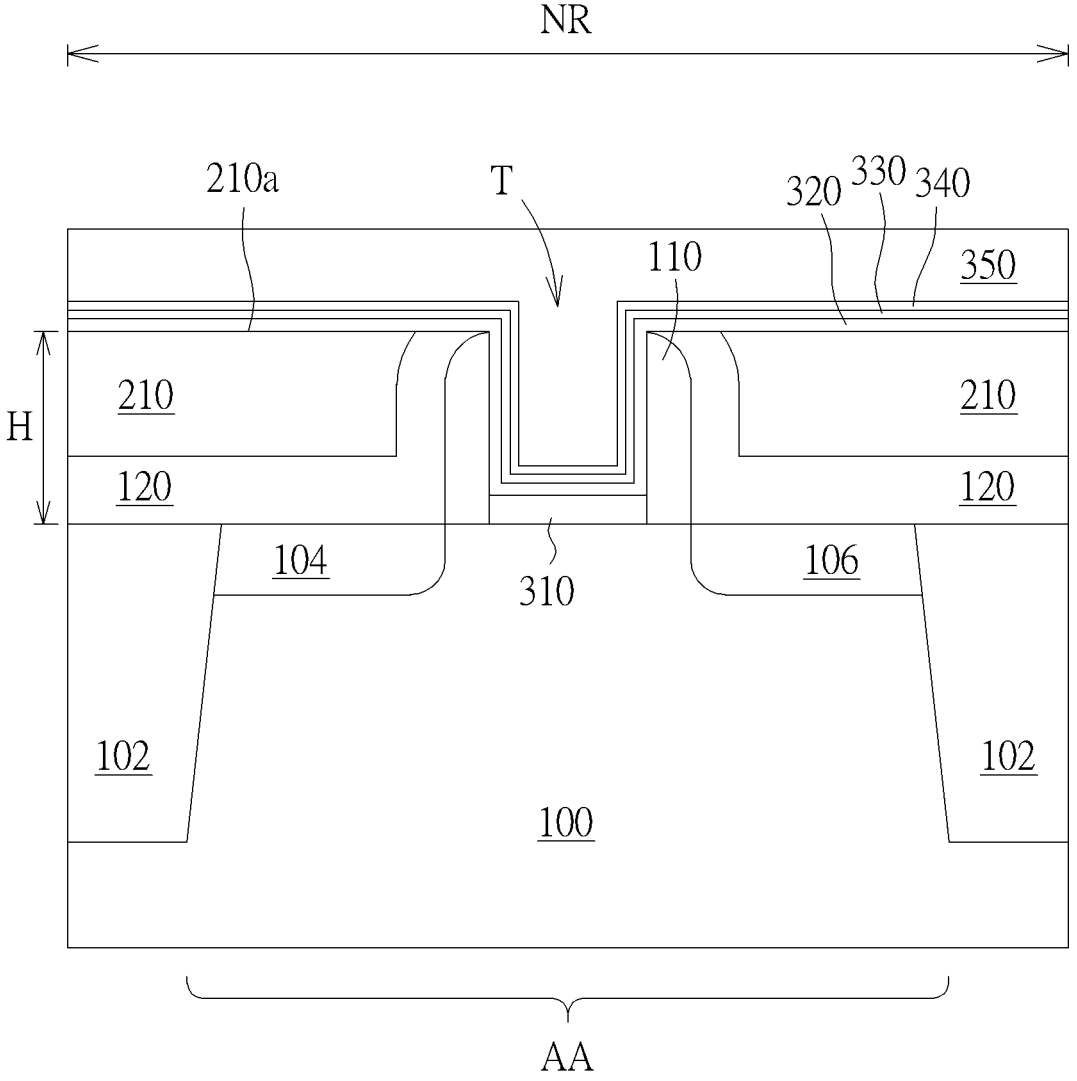

As shown in FIG. 3, a barrier layer 330 is then deposited on the metal layer 320 in the gate trench T. As shown in FIG. 3, according to an embodiment of the present invention, for example, the barrier layer 330 may include TiN, but is not limited thereto. According to an embodiment of the present invention, an adhesion layer 340 is then deposited on the barrier layer 330 in the gate trench T. Referring to FIG. According to an embodiment of the present invention, for example, the adhesion layer 340 may include Ti, but is not limited thereto. According to an embodiment of the present invention, a low-resistance conductive layer 350 is then deposited on the adhesion layer 340 in the gate trench T, wherein the metal layer 320, the barrier layer 330, the adhesion layer 340 and the low-resistance conductive layer 350 completely fill the gate trench T. According to an embodiment of the present invention, for example, the low-resistance conductive layer 350 may include Al, but is not limited thereto.

Figure 4:
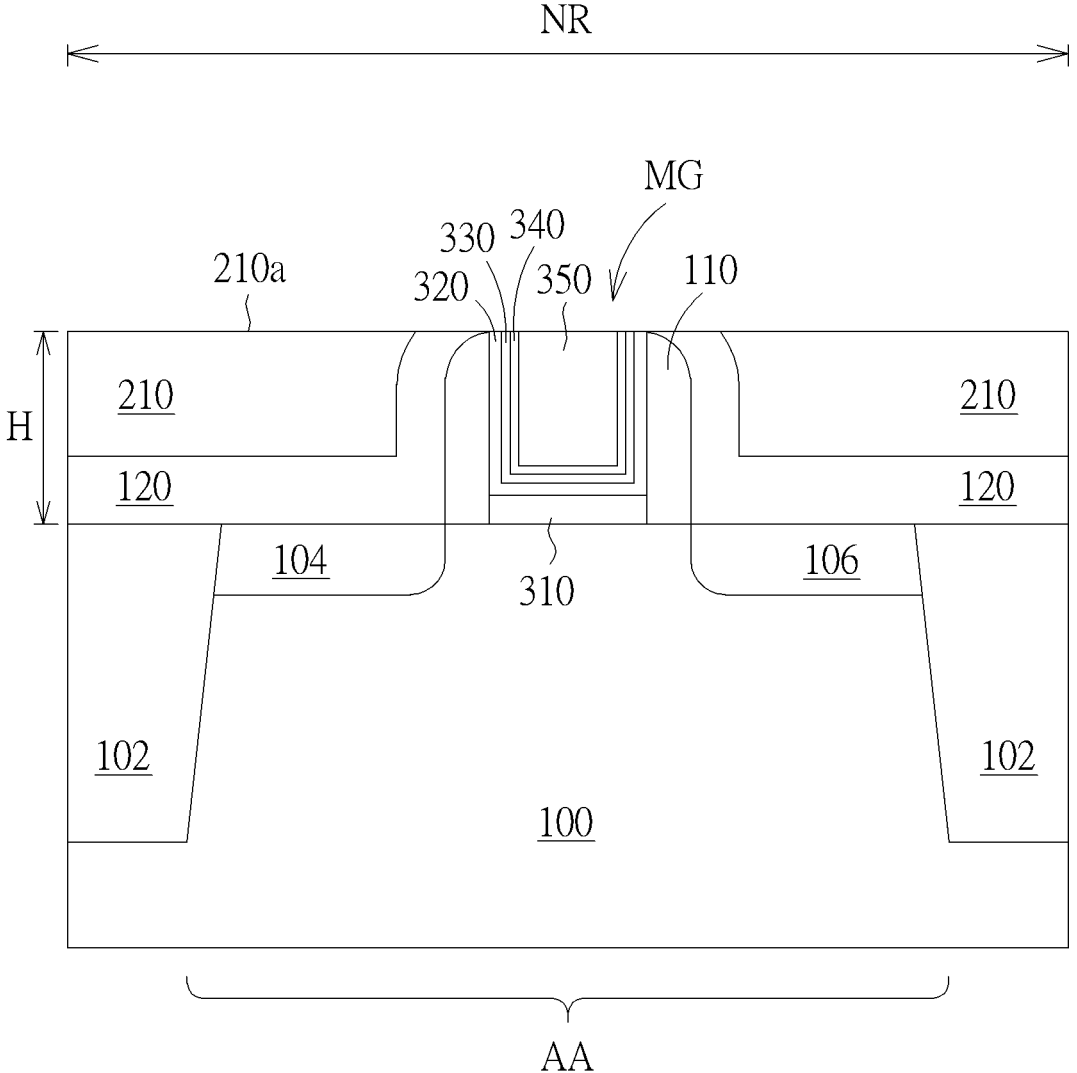

As shown in FIG. 4, subsequently, a chemical mechanical polishing (CMP) process is performed to remove the metal layer 320, the barrier layer 330, the adhesion layer 340 and the low-resistance conductive layer 350 on the top surface 210*a* of the interlayer dielectric layer 210, thereby forming metal gate MG.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a semiconductor structure, comprising:

providing a substrate having a dielectric layer thereon and a gate trench formed in the dielectric layer; and performing a physical vapor deposition (PVD) process on the substrate in a physical vapor deposition chamber equipped with an auto capacitance tuner to conformally deposit a metal layer on a top surface of the dielectric layer and on an interior surface of the gate trench, wherein the PVD process comprises: (i) tuning the auto capacitance tuner to provide positive radio frequency (RF) bias to the substrate in the PVD chamber for a first time period; and (ii) subsequently tuning the auto capacitance tuner to provide negative RF bias to the substrate in the PVD chamber for a second time period.

2. The method according to claim 1, wherein the dielectric layer comprises a silicon oxide layer.

3. The method according to claim 1 further comprising:

forming a contact etch stop layer between the dielectric layer and the substrate.

4. The method according to claim 3 further comprising:

forming a spacer layer between the metal layer and the contact etch stop layer.

5. The method according to claim 1 further comprising a metal gate of an NMOS transistor filling the gate trench.

6. The method according to claim 5, wherein the metal layer is NMOS work function layer.

7. The method according to claim 1, wherein the metal layer comprises TiAl.

8. The method according to claim 1 further comprising: depositing a barrier layer on the metal layer within the gate trench.

9. The method according to claim 8, wherein the barrier layer comprises TiN.

10. The method according to claim 8 further comprising: depositing an adhesion layer on the barrier layer within the gate trench.

11. The method according to claim 10, wherein the adhesion layer comprises Ti.

12. The method according to claim 10 further comprising: depositing a low-resistance conductive layer on the adhesion layer within the gate trench, wherein the metal layer, the barrier layer, the adhesion layer, and the low-resistance conductive layer completely fills the gate trench.

13. The method according to claim 12, wherein the low-resistance conductive layer comprises Al.

14. The method according to claim 1, wherein the positive RF bias is +85V and the first time period is 10-30 seconds.

15. The method according to claim 14, wherein the negative RF bias is 0V to −250V and the second time period is 10-30 seconds.

16. The method according to claim 1, wherein the metal layer has a thickness of 80-120 angstroms.

* * * * *